(12) United States Patent
Horn et al.

(10) Patent No.: US 11,402,760 B2
(45) Date of Patent: Aug. 2, 2022

(54) OPTICAL ARRANGEMENT AND LITHOGRAPHY APPARATUS

(71) Applicant: Carl Zeiss SMT GmbH, Oberkochen (DE)

(72) Inventors: Jan Horn, Munich (DE); Stefan Richter, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/480,800

(22) Filed: Sep. 21, 2021

(65) Prior Publication Data

US 2022/0004107 A1 Jan. 6, 2022

Related U.S. Application Data

(63) Continuation of application No. PCT/EP2020/058366, filed on Mar. 25, 2020.

(30) Foreign Application Priority Data

Mar. 26, 2019 (DE) .......................... 102019204165.5

(51) Int. Cl.
*G03F 7/20* (2006.01)
*G02B 5/08* (2006.01)
*G01S 17/32* (2020.01)

(52) U.S. Cl.
CPC ....... *G03F 7/70075* (2013.01); *G02B 5/0816* (2013.01); *G03F 7/7085* (2013.01); *G03F 7/70116* (2013.01); *G01S 17/32* (2013.01)

(58) Field of Classification Search
CPC ............... G02B 5/0816; G03F 7/70075; G03F 7/70116; G03F 7/7085
See application file for complete search history.

(56) References Cited

U.S. PATENT DOCUMENTS 6,787,745 B2 * 9/2004 Hajjar ................. G02B 6/3598
370/216
8,508,717 B2 * 8/2013 Tanaka ................ G03F 7/70108
355/71

(Continued)

FOREIGN PATENT DOCUMENTS

DE 102015216438 A1 3/2017
WO WO 2010/049076 A2 5/2010

OTHER PUBLICATIONS

T. Sandner et al., "Large aperture MEMS scanner module for 3D distance measurement," Proc. SPIE 7594, MOEMS and Miniaturized Systems IX, 75940D (Feb. 17, 2010).

(Continued)

*Primary Examiner* — Hung V Nguyen
(74) *Attorney, Agent, or Firm* — Fish & Richardson P.C.

(57) ABSTRACT

An optical arrangement for a lithography apparatus has a microsystem with a mirror array. A respective mirror of the mirror array is set up to reflect working light of the lithography apparatus on its front side and also a measuring beam on its rear side. One or more radiation sources, which are provided outside the microsystem, are set up to provide the respective measuring beam. One or more sensor units are set up to sense a tilting angle of a respective mirror in dependence on the respectively reflected measuring beam.

20 Claims, 13 Drawing Sheets

(56) References Cited

U.S. PATENT DOCUMENTS

| | | | |
|---|---|---|---|
| 8,570,502 B2 * | 10/2013 | Richter | G01B 11/26 356/138 |
| 2002/0070335 A1 | 6/2002 | Orcutt et al. | |
| 2002/0113200 A1 | 8/2002 | Hajjar et al. | |
| 2007/0139646 A1 | 6/2007 | Singh | |
| 2012/0044474 A1 | 2/2012 | Hauf et al. | |
| 2018/0188656 A1 | 7/2018 | Bihr et al. | |
| 2018/0217506 A1 | 8/2018 | Deguenther et al. | |

OTHER PUBLICATIONS

Tortschanoff et al, "Compact optical position feedback scheme for MOEMS mirrors," Microsyst Technol (2014) 20:743-749.
Translation of International Search Report for corresponding PCT Appl No. PCT/EP2020/058366, dated Jul. 15, 2020.

* cited by examiner

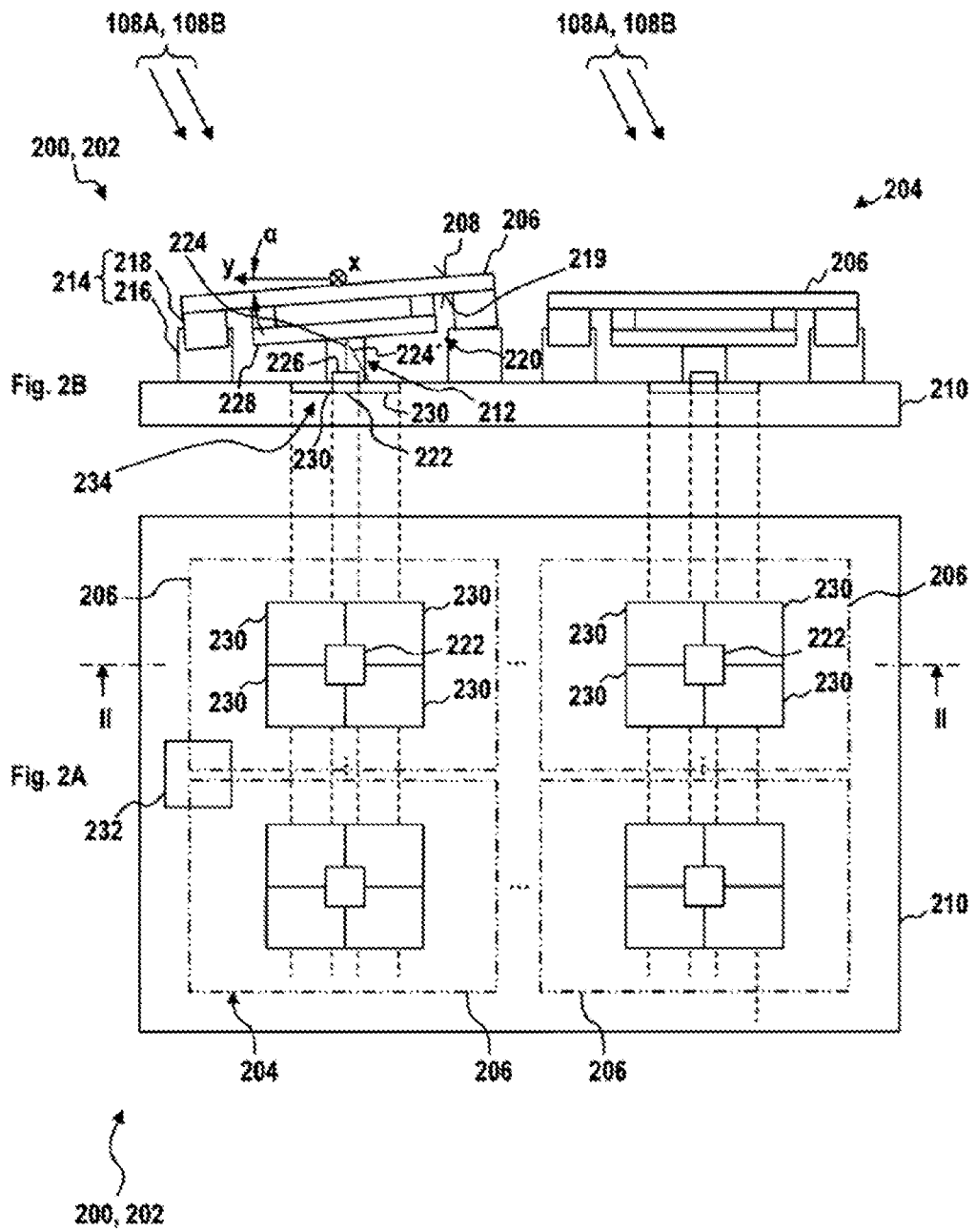

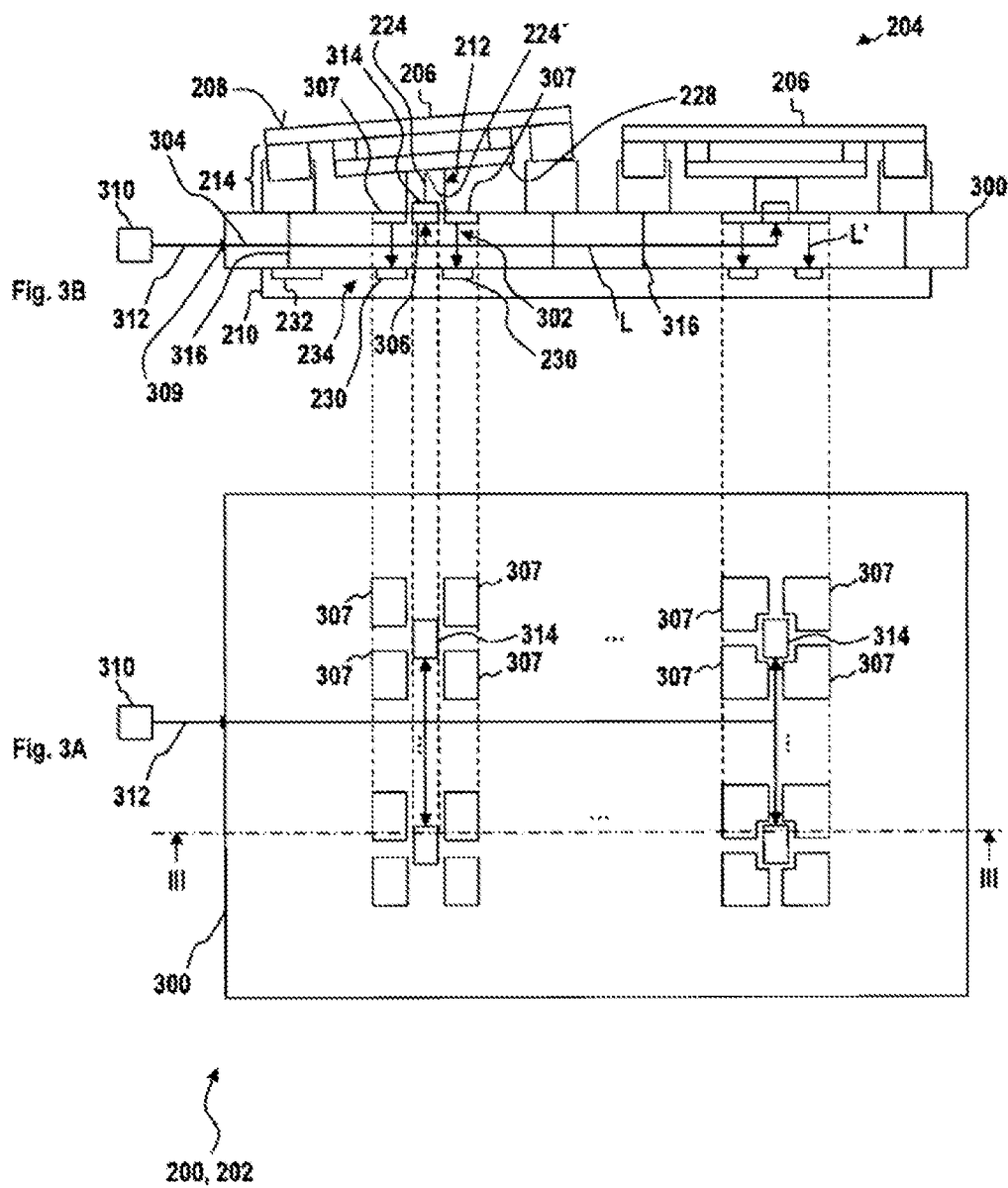

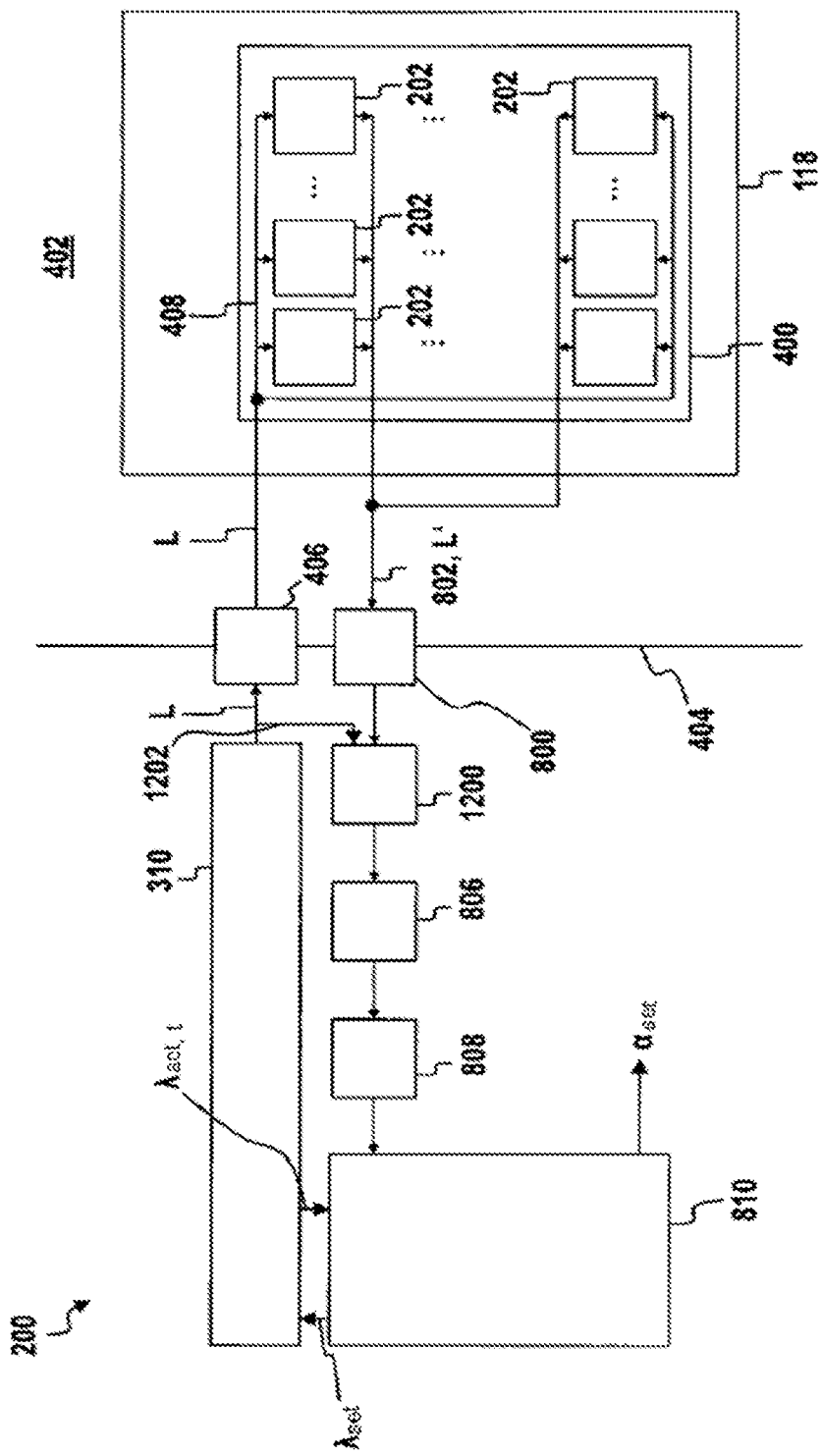

OPTICAL ARRANGEMENT AND LITHOGRAPHY APPARATUS

CROSS-REFERENCE TO RELATED APPLICATIONS

The present application is a continuation of, and claims benefit under 35 USC 120 to, international application PCT/EP2020/058366, filed Mar. 25, 2020, which claims benefit under 35 USC 119 of German Application No. 10 2019 204 165.5, filed Mar. 26, 2019. The entire disclosure of these applications are incorporated by reference herein.

FIELD

The present disclosure relates to an optical arrangement and to a lithography apparatus.

BACKGROUND

Microlithography is used for producing microstructured components, such as for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

In lithography apparatuses designed for the EUV range, i.e. at wavelengths of for example approximately 13 nm, mirrors are used as optical components for the imaging process owing to the lack of availability of suitable light-transmissive refractive materials.

It is known to use facet mirrors in the illumination system in order to suitably shape the EUV light and guide it to the mask. Such a facet mirror includes a multiplicity of individual mirrors.

To be able to produce increasingly smaller structures on the substrate (for example a silicon wafer), it is desirable to increase the number of individual mirrors and at the same time to reduce their size. This can be achieved by producing the individual mirrors as microsystems (also known as MEMS or Micro-Electro-Mechanical Systems).

Each individual mirror can be tilted about two mutually perpendicular axes via actuators. To be able to suitably control corresponding tilting angles, sensors which sense the respective actual tilting angle are provided. In this respect, it is known to use capacitive sensors.

However, in EUV systems, for example, the achievement of a signal-to-noise ratio suitable for controlling the tilting angles presents a difficulty. This is so because EUV radiation sources can generate the EUV light in groups of pulses (also known as bursts). The groups of pulses occur with a frequency of approximately 50 to 100 Hz. Pulses within a respective group of pulses have a frequency of around 100 kHz. The electrical fields thereby occurring can create undesired disturbances in the frequency range relevant to control via capacitive sensors.

In addition to this there is also the fact that many other components in the vicinity of the sensors operate capacitively. The production of the facet mirrors as a microsystem and the concomitant effect that it brings the components even closer together can further increase the capacitive interaction.

SUMMARY

The present disclosure seeks to provide an improved optical arrangement and an improved lithography apparatus.

Accordingly, in an aspect of the disclosure, an optical arrangement for a lithography apparatus is proposed. It includes:

a microsystem with a mirror array, wherein a respective mirror of the mirror array is set up to reflect working light of the lithography apparatus on its front side and also a measuring beam on its rear side, one or more radiation sources, which are set up to provide the respective measuring beam, and one or more sensor units, which are set up to sense a tilting angle of a respective mirror in dependence on the respectively reflected measuring beam.

The fact that the tilting angle is sensed with the aid of a measuring beam means that the tilting angle is sensed by optical means—and not by capacitive means—and is correspondingly sensed in a different (control) domain. The signal-to-noise ratio is thereby improved and the sensitivity to electrical disturbances is reduced. Furthermore, a greater accuracy can be achieved with optical measuring systems than with capacitive measuring systems, which can be desirable for example with regard to the miniaturized structures of the micro-system. Finally, optical systems can also be calibrated more easily.

The arrangement is suitable for example for a lithography apparatus, for example an EUV or a DUV lithography apparatus. The arrangement may however also be suitably formed for a measuring system for the optical measurement of a lithography apparatus or for some other optical system.

A microsystem is understood here as meaning such systems in which the individual components have a size (maximum edge length) of between 0.001 and 5 mm. A further characteristic of microsystems is that they can be produced by methods of semiconductor production. These include for example etching and spark erosion and also the use of thin-film technologies (for example sputtering).

A mirror array is understood as meaning an array of micromirrors. Each micromirror may for example have a mirror area of less than or equal to 5, 1 or 0.5 mm². For example, a mirror array may have 32×32 or 64×64 mirrors.

A respective mirror can be set up to reflect working light of the lithography apparatus (or other light within the optical system that the apparatus has) on its front side. Working light means in connection with a lithography apparatus the light that the structure generates on the substrate (for example the wafer). This may be EUV or DUV light. In the case of some other optical system, the working light is the light that serves for the main purpose of the optical system. If, for example, the optical system is formed as a measuring system for the optical measurement of a lithography apparatus, then the working light is a corresponding light beam for the optical measurement.

Furthermore, a respective mirror is set up to reflect the provided measuring beam on its rear side. The reflection may take place indirectly or directly on the rear side. For example, the provided measuring beam may be reflected at a portion of a mounting arranged on the rear side of the mirror, for example a mounting that is securely connected to a surface of the rear side of the mirror (this is an example of indirect reflection). The mounting serves for the tilting of a respective mirror, for changing the tilting angle. As an alternative or in addition, the light may impinge directly on the surface of the rear side of the mirror, that is to say without reflection at a further component (such as the mounting) arranged in between the rear side and the reflecting surface.

The mirrors of the mirror array may be a component part of a facet mirror. The facet mirror may be arranged in the illumination system of the lithography apparatus.

The measuring beam may have light at a wavelength of 100 nm to 3000 nm, such as between 380 and 800 nm (visible light) or between 800 and 1650 nm (near-infrared range).

A light-emitting diode—hereinafter "LED"—or laser, for example the Continuously Tunable Laser from TOPTICA Photonics AG, can come into consideration for example. In some embodiments, precisely one radiation source per microsystem, mirror module or facet mirror may be provided.

A (or the respective) sensor unit may be formed as a photodiode.

The tilting angle is the angle that is obtained when the mirror (single mirror) turns about an axis which lies in, or substantially in, the plane of the mirror surface. Generally two such axes, which may be mutually perpendicular, are provided. Correspondingly, a first tilting angle and/or second tilting angle is measured via a respective sensor unit.

A (or the respective) radiation source may be set up to generate the measuring beam in a phase-modulated or frequency-modulated manner. This can make the measurement less sensitive to the noise described at the beginning.

According to some embodiments, the microsystem has a substrate, on which the mirror array is arranged, wherein a respective mirror is tiltably mounted on the substrate.

For the purposes of mounting, flexures may be provided. The flexures may in each case be fastened on the one hand on the substrate and on the other hand on a respective mirror, for example be formed in one piece with them. Furthermore, two or more mirrors can be tiltably mounted on one and the same substrate (monolithic substrate). The substrate may be produced from a semiconductor material. The semiconductor material may include silicon and/or indium phosphide. Silicon is suitable as a carrier material for electronic components, whereas indium phosphide is suitable as a carrier material for optical components. For example, at least one conductor track for electrical current (for example for forming an electrical integrated circuit) and/or at least one light guide (for example for forming a photonic integrated circuit) may be formed in the structure of semiconductor material.

According to some embodiments, the one or more radiation sources are provided outside the microsystem. The one or more radiation sources can be arranged outside a vacuum region of the arrangement or lithography apparatus.

LEDs and lasers as a radiation source often have to be exchanged because of a defect. Access, and consequently exchange, can be made considerably easier by the fact that the radiation source is now arranged outside the microsystem, or even outside the vacuum region. The vacuum region means for example the region within an EUV lithography apparatus that has the beam path. This region (also referred to as the mini environment) is generally kept particularly clean. In the vacuum region there is a pressure of for example 0.1 Pa.

According to some embodiments, the microsystem has an integrated optical unit, which is set up to guide the provided measuring beam to a respective mirror.

The production of the microsystem with an integrated optical unit can allow this step to be taken in the form of mass production at low costs. At the same time, integrated optical units are generally of a very small size. An integrated optical unit (also known as a photonic integrated circuit) is understood in the present case as being an optical unit which has at least two photonic functional units (light input coupling, light output coupling, radiation source, waveguide, beam splitter, intensity or phase modulators, filter, switch etc.), which are provided in or on a substrate. The functional units can use light in the visible or near-infrared range, as defined above, for or in the performance of their respective function. The functional units can form a monolithic component with the substrate. The substrate may be the one on which the mirror array is arranged. For example, the integrated optical unit can be set up to guide the provided measuring beam to the rear side of a respective mirror.

According to some embodiments, the integrated optical unit is set up to guide the respectively reflected measuring beam or a signal generated in dependence on it to the one or more sensor units.

For this purpose, the integrated optical unit can have at least one light guide, which guides the reflected measuring beam or the generated signal to the one or more sensor units. For example, the signal may also be generated in dependence on the respectively provided measuring beam. For example, the signal may be the time difference between the emission of the provided measuring beam and the reception of the reflected measuring beam, or a signal representing this time difference. This time difference may be determined for example by measuring a wavelength difference between the provided measuring beam (with a time-variable wavelength) and the reflected measuring beam, as explained in still more detail below for the FMCW-LIDAR method. The signal may be for example an interference signal between the provided measuring beam and the reflected measuring beam.

According to some embodiments, the microsystem has an integrated circuit which includes the one or more sensor units.

The sensor units can be produced in a low-cost and installation-space-saving manner as part of an integrated circuit. The integration of the one or more sensor units in the microsystem can also avoid a data transfer to the outside, which may be desirable with regard to the data processing speed. This also can allow a closed-loop control circuit to be provided in the microsystem itself, which tends to be less susceptible to disturbances than a data transmission to an external circuit (with respect to the microsystem) for providing the control circuit. An integrated circuit is understood in the present case as meaning an electrical circuit which is applied to a substrate including a semiconductor material, for example silicon. The electrical circuit and the substrate can form a monolithic component. The substrate may be the one on which the mirror array is arranged.

For example, it may be provided that the microsystem has a first substrate and a second substrate, one above the other. The first substrate can contain the integrated optical unit, the second substrate contains the integrated circuit. The mirror array may be arranged on the first substrate or second substrate, i.e. its mirrors are tiltably mounted on the first substrate or second substrate. The mirror array can be arranged on the first substrate and the second substrate is arranged under the first substrate. In this case, a respectively reflected measuring beam or the generated signal is allowed to pass through a respective opening (light-entry region) in the first substrate to the second substrate and is sensed there by a respective sensor unit.

According to some embodiments, the microsystem includes a substrate which has both the integrated optical unit and the integrated circuit. That is to say that the substrate forms a monolithic component with the optical functional units and the electrical circuit.

According to some embodiments, the one or more sensor units are provided outside the microsystem.

This can allow the complexity in the microsystem to be reduced.

According to some embodiments, the radiation source is set up to provide the measuring beam at a wavelength which varies over time, wherein a respective mirror is assigned one or more filters, which are set up to allow the reflected measuring beams or signals generated from them to pass through to the one or more sensor units only in a predetermined wavelength pass-band, wherein the wavelength pass-bands of the filters differ from one another.

On the basis of the wavelength of the reflected measuring beam that is allowed to pass through, the assignment of the filters to different tilting angles of the mirror, and possibly to different mirrors, and also the actual intensity of the reflected measuring beam that is allowed to pass through, it is possible to deduce the tilting angle, and possibly the respective mirror that has this tilting angle. Optionally, the following implementation is envisaged here: The reflected measuring beam has an intensity distribution, for example a Gaussian intensity distribution, over the sensor units or light-entry regions. The intensity distribution spans at least two, three, four, sensor units or light-entry regions. By measuring the actual intensities in each sensor unit and performing a downstream centroid determination of the (Gaussian) intensity distribution, the tilting angle of the mirror assigned to the sensor units or light-entry regions can be determined.

According to some embodiments, the microsystem has a multiplexer, which is set up to multiplex the reflected measuring beams or signals generated from them onto a light guide, and wherein furthermore a demultiplexer, which is set up to demultiplex the measuring beams or signals multiplexed onto the light guide, is provided (for example outside the microsystem).

In this way it is possible to reduce the number of light guides that are involved. The connection of the microsystem to its surroundings for signaling purposes can be correspondingly simplified. The light guide can be connected to a sensor unit, which senses the respectively multiplexed measuring beam or the multiplexed signal. The sensor unit can in this case be easily arranged outside the microsystem, and possibly outside the vacuum region.

According to some embodiments, the one or more sensor units are set up to sense the tilting angle of a respective mirror in dependence on a deflection of the reflected measuring beam with respect to the provided measuring beam.

For example, the sensor units are arranged at different positions in a plane under a respective mirror. Depending on the tilting angle, the reflected measuring beam or the generated signal falls on a different sensor unit—depending on its centroid. The sensor units may be provided in the form of a CCD (also known as a charge coupled device) image sensor. On account of the multiplicity of sensor units that are consequently present, the tilting angle can be sensed comparatively accurately.

According to some embodiments, the microsystem has a first substrate with multiple light-entry regions and a second substrate with the multiple sensor units, wherein the multiple light-entry regions are set up to guide the reflected measuring beam to the multiple sensor units.

The light-entry regions may be formed as apertures, glass inserts, glass vias and/or grating couplers in the first substrate. Alternatively, light guides, which connect the respective light-entry region to a respective sensor unit in the second substrate in a light-guiding manner, may be provided in the first substrate. The first substrate and the second substrate may be arranged one above the other and adjacent to one another. The light guides may be formed as an integrated optical unit in the first substrate, the sensor units may be formed as integrated circuits in the second substrate.

According to some embodiments, the multiple light-entry regions have filters with different wavelength pass-bands.

This can allow the multiplexing described above to be easily accomplished via the filters, different channels are provided. The light intensity or signal strength per channel can be used to determine the aforementioned centroid of the light intensity distribution, and consequently the tilting angle of the corresponding mirror.

According to some embodiments, the one or more sensor units are set up to sense the tilting angle of a respective mirror with the aid of a distance measurement in dependence on the provided and reflected measuring beam. The distance measurement—in contrast to the sensing of the deflection of the measuring beam—is based on the measurement of signal transit times. The distance measurement can be performed between at least two (e.g., three) points in each case on the rear side of the mirror (for example the surface of the rear side of the mirror) and a reference on the substrate. The two points may for example lie in corners of the rear side of the mirror. A measurement can often be performed better here than in the middle of the rear side of the mirror, because the rear side is generally occupied by the mounting for the tiltable securement of the mirror (for example in the form of one or more flexures), and is therefore not as easily accessible for a reflection of the measuring beam. The rear side of the mirror may be roughened in the region of a respective point, in order to allow a (partially diffuse) reflection of the provided measuring beam into an assigned light-entry region or into an assigned sensor unit.

According to some embodiments, the one or more sensor units are set up to carry out the distance measurement according to an FMCW-LIDAR method. FMCW stands for Frequency-Modulated Continuous-Wave and describes distance measurement by comparison of a frequency-modulated transmission signal with an echo reflected by a target object (here: the rear side of the mirror). A frequency comparison of the transmission signal and the echo at a given point in time can be carried out more easily in signaling terms than a mere transit-time measurement between sending the transmission signal and receiving the echo.

LIDAR stands for Light Imaging Detection and Ranging and means the scanning of target objects with the aid of light. The FMCW method is therefore carried out here with the aid of light as the transmission signal. The frequency comparison or wavelength comparison may be accomplished for example by interferometry.

The FMCW-LIDAR method is known as such and is described in detail for example in-*Vasilyev, Arseny, The optoelectronic swept-frequency laser and its applications in ranging, three-dimensional imaging, and coherent beam combining of chirped-seed amplifiers. Dissertation (Ph.D. Thesis), California Institute of Technology,* 2013.

Furthermore, a lithography apparatus with the optical arrangement described above is provided.

"A(n); one" in the present case should not necessarily be understood as restrictive to exactly one element. Rather, a plurality of elements, such as for example two, three or more, may also be provided. Any other numeral used here, too, should not be understood to the effect that there is a restriction to exactly the stated number of elements. Rather, numerical deviations upwards and downwards are possible, unless indicated to the contrary.

The embodiments and features described for the optical arrangement are correspondingly applicable to the proposed lithography apparatus, and vice versa.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below. In the text that follows, the disclosure is explained in more detail on the basis of embodiments with reference to the accompanying figures.

BRIEF DESCRIPTION OF THE DRAWINGS

FIG. 2A schematically shows an optical arrangement for a lithography apparatus according to a first exemplary embodiment in a plan view;

FIG. 2B shows a section II-II from FIG. 2A;

FIG. 3A schematically shows an optical arrangement according to a second exemplary embodiment in a plan view;

FIG. 3B shows a section from FIG. 3A;

FIG. 12 shows the arrangement from FIG. 8 according to a variant using multiple microsystems according to FIGS. 10A and B and also of the FMCW-LIDAR method according to FIG. 11.

DESCRIPTION OF EXEMPLARY EMBODIMENTS

Identical elements or elements having an identical function have been provided with the same reference signs in the figures, unless indicated to the contrary. It should also be noted that the illustrations in the figures are not necessarily true to scale.

Figure 1A:
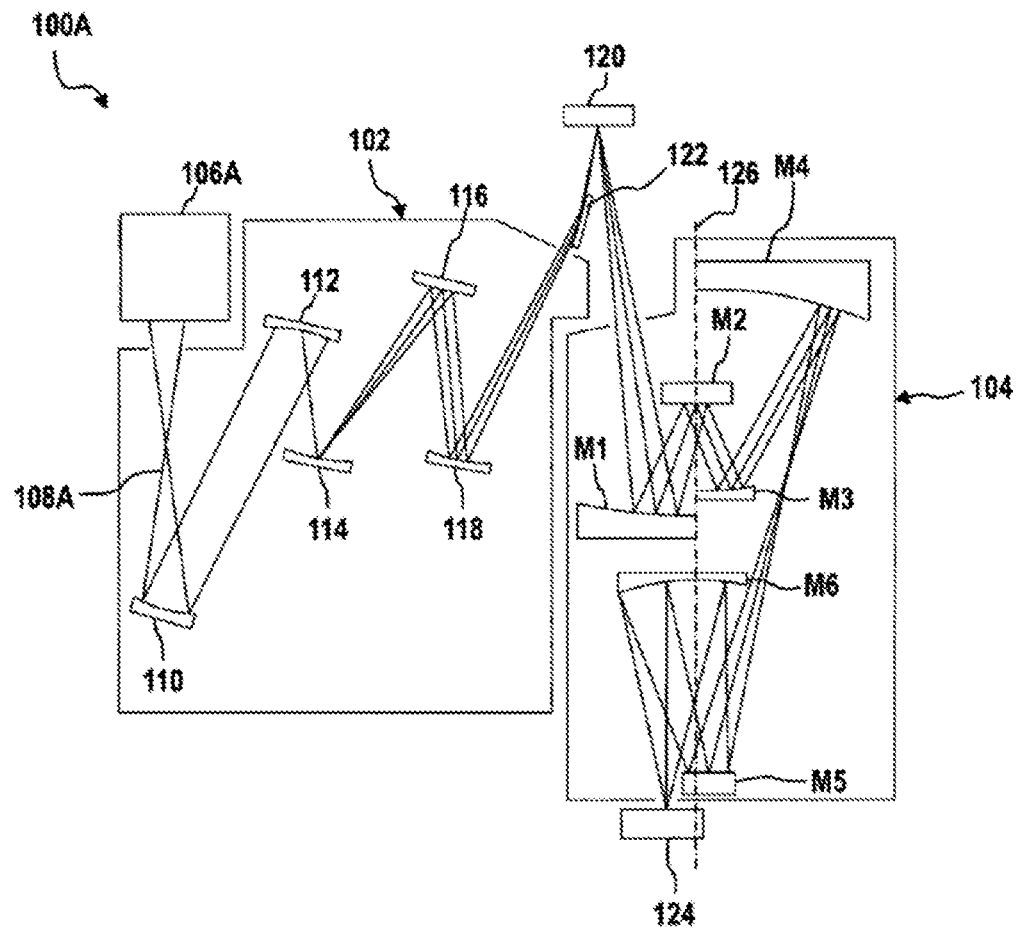
FIG. 1A shows a schematic view of an exemplary embodiment of an EUV lithography apparatus.

FIG. 1A shows a schematic view of an EUV lithography apparatus 100A including a beam-shaping and illumination system 102 and a projection system 104. In this case, EUV stands for "extreme ultraviolet" and denotes a wavelength of the working light of between 0.1 nm and 30 nm. The beam-shaping and illumination system 102 and the projection system 104 are respectively provided in a vacuum housing (not shown), wherein each vacuum housing is evacuated with the aid of an evacuation device (not shown). The vacuum housings are surrounded by a machine room (not shown), in which drive devices for mechanically moving or setting optical elements are provided. Moreover, electrical controllers and the like may also be provided in this machine room.

The EUV lithography apparatus 100A has an EUV radiation source 106A. A plasma source (or a synchrotron), which emits radiation 108A in the EUV range (extreme ultraviolet range), that is to say for example in the wavelength range of 5 nm to 20 nm, may for example be provided as the EUV radiation source 106A. In the beam-shaping and illumination system 102, the EUV radiation 108A is focused and the desired operating wavelength is filtered out from the EUV radiation 108A. The EUV radiation 108A generated by the EUV radiation source 106A has a relatively low transmissivity through air, for which reason the beam-guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto a photomask (reticle) 120. The photomask 120 is likewise formed as a reflective optical element and may be arranged outside the systems 102, 104. Furthermore, the EUV radiation 108A may be directed onto the photomask 120 via a mirror 122. The photomask 120 has a structure which is imaged onto a wafer 124 or the like in a reduced fashion via the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided. Furthermore, the mirrors M1 to M6 are generally curved at their front side for beam shaping.

Figure 1B:
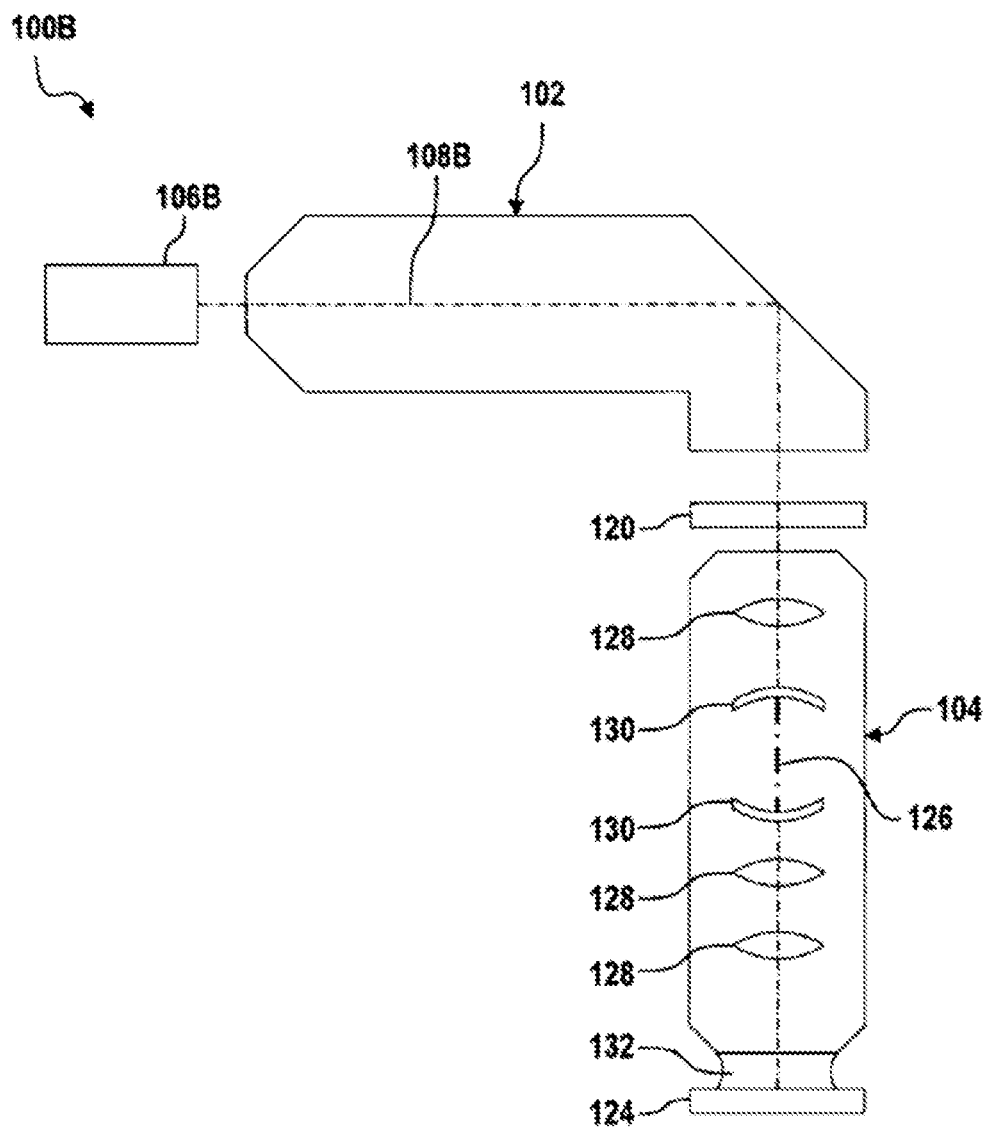
FIG. 1B shows a schematic view of an exemplary embodiment of a DUV lithography apparatus.

FIG. 1B shows a schematic view of a DUV lithography apparatus 100B, which includes a beam-shaping and illumination system 102 and a projection system 104. In this case, DUV stands for "deep ultraviolet" and denotes a wavelength of the working light of between 30 nm and 250 nm. As has already been described with reference to FIG. 1A, the beam-shaping and illumination system 102 and the projection system 104 may be arranged in a vacuum housing and/or be surrounded by a machine room with corresponding drive devices.

The DUV lithography apparatus 100B has a DUV radiation source 106B. For example, an ArF excimer laser that emits radiation 108B in the DUV range at 193 nm, for example, may be provided as the DUV radiation source 106B.

The beam-shaping and illumination system 102 illustrated in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion via the projection system 104.

The projection system 104 has multiple lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 can also be provided. Furthermore, the mirrors 130 are generally curved at their front side for beam shaping.

An air gap between the last lens element 128 and the wafer 124 can be replaced by a liquid medium 132 having a refractive index of >1. The liquid medium 132 may be for example high-purity water. Such a set-up is also referred to as immersion lithography and has an increased photolithographic resolution. The medium 132 can also be referred to as an immersion liquid.

FIG. 2A schematically shows an optical arrangement 200 according to a first exemplary embodiment in a plan view. FIG. 2B shows a section II-II from FIG. 2A. The arrangement 200 can be used for example in one of the lithography apparatuses 100A, 100B.

The optical arrangement 200 includes one or more microsystems 202, only one of which is shown in the exemplary embodiment. The microsystem 202 includes a mirror array 204 with a multiplicity of mirrors 206. The mirrors 206 are illustrated in FIG. 2A by dashdotted lines in order to allow structures under a respective mirror 206 to be seen.

The mirrors 206 are arranged in the manner of an array, that is to say in one plane, which may be flat or curved (even multiply curved). The mirrors 206 may be arranged in rows and columns, for example in such a way that they occupy a square area. For example, 32×32 or 64×64 mirrors 206 per microsystem 200 may be provided. A microsystem 202 formed in such a way may also be referred to as a "brick". The mirror surface 208 (hereinafter also the "front side") of a respective mirror 216 may for example be smaller than or equal to 5, 1 or 0.5 mm². On the front side 208 or surface of the front side 208, a respective mirror 206 reflects part of the working light 108A, 108B during an exposure process in the lithography apparatus 100A, 100B. Several hundred of the microsystems 202 may be combined to form a unit, for example a facet mirror 118 (see FIG. 1A) within the illumination system 102.

Furthermore, the microsystem 202 includes a two-dimensional monolithic substrate 210. "Monolithic" means that it is produced as a one-piece or monocrystalline component. According to the first exemplary embodiment, the substrate 210 is produced from semiconductor material, for example silicon.

The mirror array 204 is arranged on the substrate 210. In this case, a respective mirror 206 is tiltably mounted on the substrate 210 with the aid of a mounting 212. For example, the mounting 212 may have one or more flexures. The tilting may be performed about two mutually perpendicular axes x, y. The plane defined by the axes x, y can be oriented parallel to the main plane of extent (corresponding to the plane of the paper in FIG. 2A) of the substrate 210. The mirror 206 illustrated on the left in FIG. 2B is shown in a position tilted by a tilting angle α about the x axis. Changing the tilting angle α has the effect that the incident working light 108A, 108B is directed, and consequently the exposure is suitably influenced.

One or more actuators 214 are provided for tilting a respective mirror 206 about the axes x, y. A respective actuator 214 may be made up of two combs 216, 218, wherein one comb 216 is arranged on the substrate 210 and the other comb 218 is arranged on a rear side 220 of the mirror 206, for example a surface 219 of the rear side 220 of the mirror 206. The combs 216, 218 engage in one another. The depth of engagement is determined by the electrical charge of the combs 216, 218. The relationship of the respective depth of engagement and the geometrical arrangement of the actuators 214 on the rear side 220 of the mirror 206 produces the tilting angle α about the x axis and a tilting angle (not shown) about the y axis. The actuators 214 are accordingly formed capacitively. However, other types of activation, for example with the aid of Lorentz actuators, are also conceivable.

The substrate 210 has multiple radiation sources 222, optionally one radiation source 222 per mirror 206. The radiation sources 222 are formed for example as LEDs. Each radiation source 222 generates a measuring beam 224. The measuring beam 224 may include light in the visible spectrum or near-infrared spectrum.

Downstream of the radiation source 222 there may be an optical unit 226, for example a lens element, which modifies the measuring beam 224. In the present case, the modified measuring beam 224 impinges on a portion 228 of the mounting 212 and is reflected by it. The portion 228 is securely connected to the surface 219 of the rear side 220 of the mirror 206, and therefore exactly follows its tilting. The reflected measuring beam is denoted by 224'. The reflection of the measuring beam 224 on the portion 228 of the mounting 212 has the effect that an indirect reflection of the measuring beam 224 takes place on the rear side 220 of the mirror 206.

Multiple sensor units 230 are arranged around the respective radiation source 222. The sensor units 230 may be formed as photodiodes. Depending on the sensor unit 230 on which the measuring beam 224' impinges, its deflection, and consequently the tilting angle α of the mirror 206, can be deduced. If the measuring beam 224' has a finite extent, for example a Gaussian profile, the tilting angles of the mirror 206 can be determined on the basis of the ratios of the components of the measuring beam 224' entering the sensor units 230, as already explained above (centroid).

For example, four sensor units 230 may be provided, arranged in quadrants around the radiation source 222. More accurate sensing of the deflection of the measuring beam 224', and consequently of the tilting angle α, can be achieved if an imaging CCD or CMOS chip with a multiplicity of sensor units 230, for example several hundred or several thousand, is used.

The determination of the tilting angle α may be performed with the aid of a microprocessor 232. The microprocessor 232 may be assigned memory (not shown), such as ROM, RAM, EEPROM or flash memories. The microprocessor 232 controls the mirrors 206 in dependence on setpoint tilting angles and actual tilting angles. The microprocessor receives the setpoint tilting angles from a central control unit of the lithography apparatus 100A, 100B. The microprocessor 232 is connected for signaling purposes to the sensor units 230. The microprocessor 232 calculates the actual tilting angles from the sensor signals provided by the sensor units, which generate them in dependence on the centroid of the reflected measuring beam 224'.

As shown, the microprocessor 232 together with the memory may also be arranged on the substrate 210.

All of the components of the microsystem 202 (apart from the substrate 210 itself), that is to say the mirrors 206, the mountings 212, the actuators 214, the radiation source 222, the sensor units 230 and/or the microprocessor 232 together with the memory, can be produced by microsystem technology. This involves using methods of semiconductor production, such as for instance etching and spark erosion, and using thin-film technologies (for example sputtering). The stated single components have in each case a size (maximum edge length) of between 0.001 and 5 mm or smaller.

Furthermore, in the case of this first exemplary embodiment, the semiconductor material of the substrate 210 serves as carrier material for an integrated circuit 234, which includes the radiation sources 222, sensor units 230 and possibly combs 216 of the actuators 214 and/or the microprocessor 232 together with memory as an integrated component part.

The following exemplary embodiments are in each case based on the respectively previous one, unless indicated to the contrary. FIG. 3A schematically shows an optical arrangement 200 according to a second exemplary embodiment in a plan view. FIG. 3B shows a section III-III from FIG. 3A.

FIG. 3A shows a first substrate 300, which includes a semiconductor material, for example indium phosphide. This serves as carrier material for an integrated optical unit 302. The integrated optical unit 302 includes a light guide 304, light-exit regions 306 and light-entry regions 307. The (integrated) light guide 304 is connected in a light-guiding manner to a radiation source 310 outside the microsystem 202 by way of a port 309. For this purpose, a fiber-optic cable 312 or the like, which is connected to the port 309, is provided. The radiation source 310 generates light in the visible or near-infrared range.

In an alternative embodiment that is not shown, the integrated optical unit 302 has multiple light guides 304. These respectively connect some of the light-exit regions 306 to a respective port 309.

The light-exit regions 306 are respectively connected in a light-guiding manner to the light guide 304, which provides light L at these regions. Downstream of each of the light-exit regions 306 there may be for example a lens element 314, which provides the measuring beam 224 and directs it onto the portion 228 of the mounting 212. The measuring beam 224' reflected at the portion 228 falls onto one of the light-entry regions 307, in dependence on the tilting angle α. According to the exemplary embodiment, four light-entry regions 307 are provided, arranged in quadrants around the light-exit region 306 or its lens element 314. More accurate sensing of the deflection of the measuring beam 224, and consequently the tilting angle α, can be achieved if a greater number of light-entry regions 307 are used, for example several hundred or several thousand.

Provided under the first substrate 300 is the—in this case second—substrate 210. Here—in contrast to the first exemplary embodiment—the integrated circuit 210 has no radiation source 222. The sensor units 230 are connected in a light-guiding manner to the light-entry regions 307 of the first substrate 300. Furthermore, the microprocessor 232 is connected in signaling terms with the aid of electrical vertical interconnect accesses 316 (also known as vias) through the first substrate 210 to the actuators 214, or the amplifiers (not shown) upstream of them. In dependence on the amounts of light that arrive at the sensor units 230, the microprocessor 232 determines the tilting angle α of a respective mirror 206 (Gaussian intensity distribution and centroid determination, as explained above). In the same way as in the case of the exemplary embodiment according to FIGS. 2A and 2B, the controlling of the tilting angle α therefore takes place in the microsystem 202.

In an embodiment that is not shown, a single substrate could be provided, having both the integrated optical unit 302 and the integrated circuit 234.

In the case of a second exemplary embodiment, it is sufficient if there is only one radiation source 310 per microsystem 202. Or else one radiation source 310 may be provided, supplying multiple microsystems 202 with light. This case is illustrated in FIG. 4.

Figure 4:
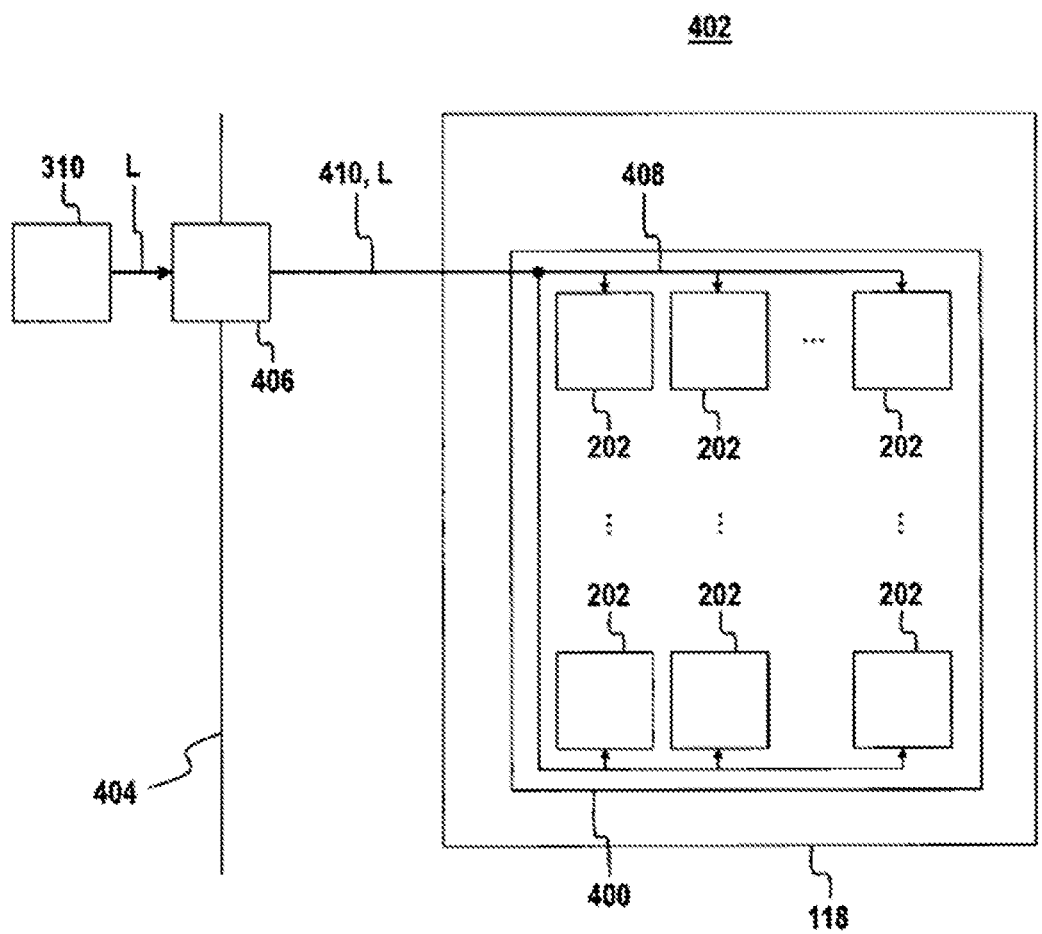
FIG. 4 shows an optical arrangement according to a third exemplary embodiment in a plan view.

FIG. 4 shows an optical arrangement 200 according to a third exemplary embodiment in plan view, as seen for instance in a detail of one of the lithography apparatuses 100A, 100B.

This includes for example a facet mirror 118 (also see FIG. 1A), which has multiple mirror modules 400 (for the sake of overall clarity, only one is shown), for example several hundred. Each mirror module 400 has in turn a multiplicity of microsystems 202 as described in connection with FIGS. 3A and 3B. For example, a respective mirror module 400 may have between 2 and 1000 microsystems 202.

Each mirror module 400 or all of the mirror modules 400 is/are supplied with light L by a single radiation source 310. As in the exemplary embodiment shown in FIG. 4, the radiation source 310 may be arranged not only outside the facet mirror 118 but outside the vacuum region 402 enclosing it. A housing that delimits the vacuum region 402 from the rest of the lithography apparatus 100A is denoted by 404.

The light L generated by the radiation source 310 is passed with the aid of an interface 406 (VFT—Vacuum Feedthrough) from outside to inside the vacuum region 402. Using light guide 408, the light L is distributed among the microsystems 202. There may be provided precisely one channel 410 (for example in the form of a fibre-optic cable), which connects the interface 406 in a light-guiding manner to all of the microsystems 202 or some of the microsystems 202 of the facet mirror 118 or of the mirror modules 400 or of a respective mirror module 400.

Also in the case of an exemplary embodiment according to FIG. 4, the tilting angle control may in turn be performed within each microsystem 202 for the mirrors 206 respectively included by the system, to be precise for example with the aid of a respective microprocessor 232.

Figure 5:
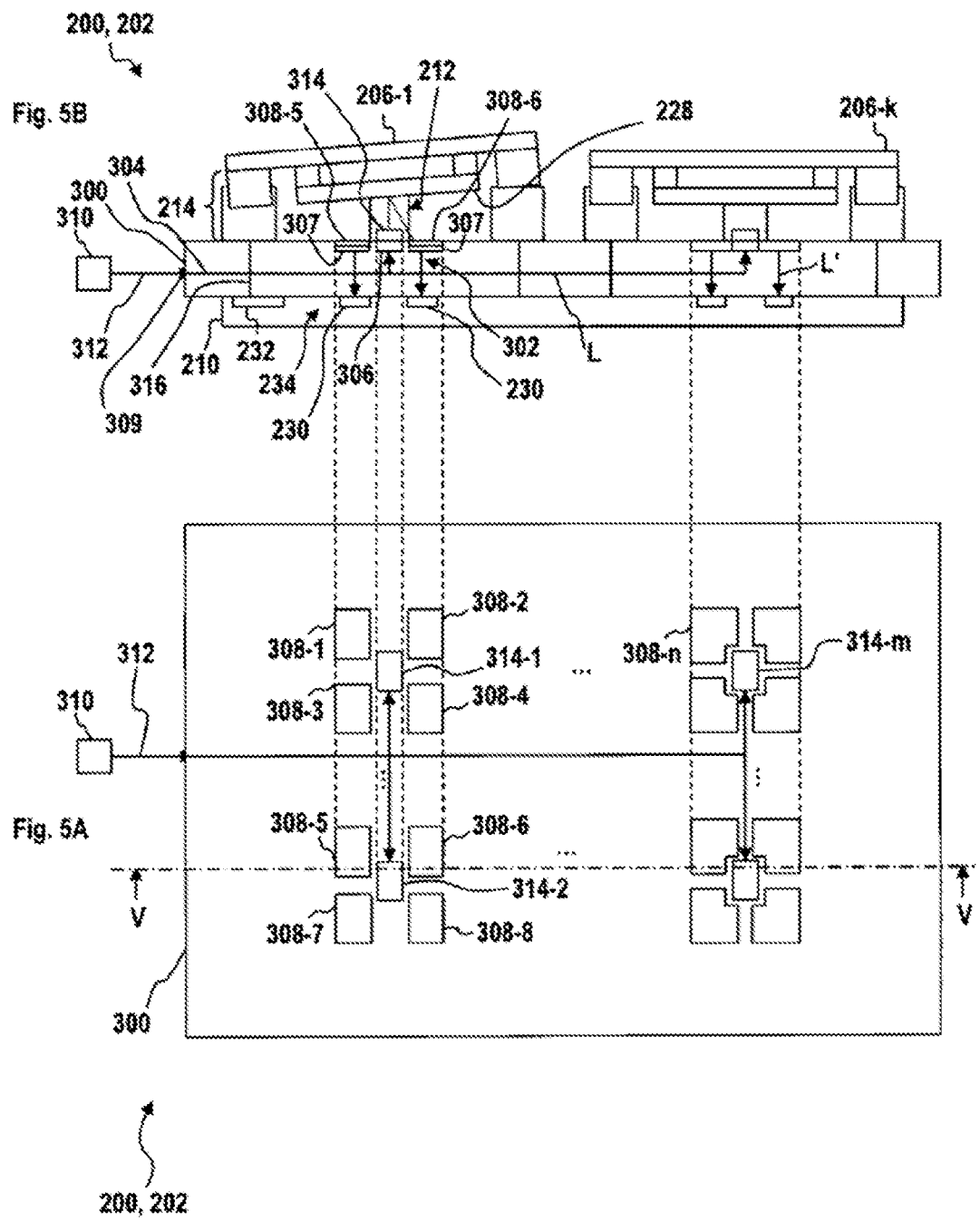
FIG. 5A schematically shows an optical arrangement according to a fourth exemplary embodiment in a plan view.
FIG. 5B shows a section V-V from FIG. 5A.

FIG. 5A schematically shows an optical arrangement 200 in a plan view (for example for one of the lithography apparatuses 100A, 100B) according to a fourth exemplary embodiment. FIG. 5B shows a section V-V from FIG. 5A.

Figure 6:
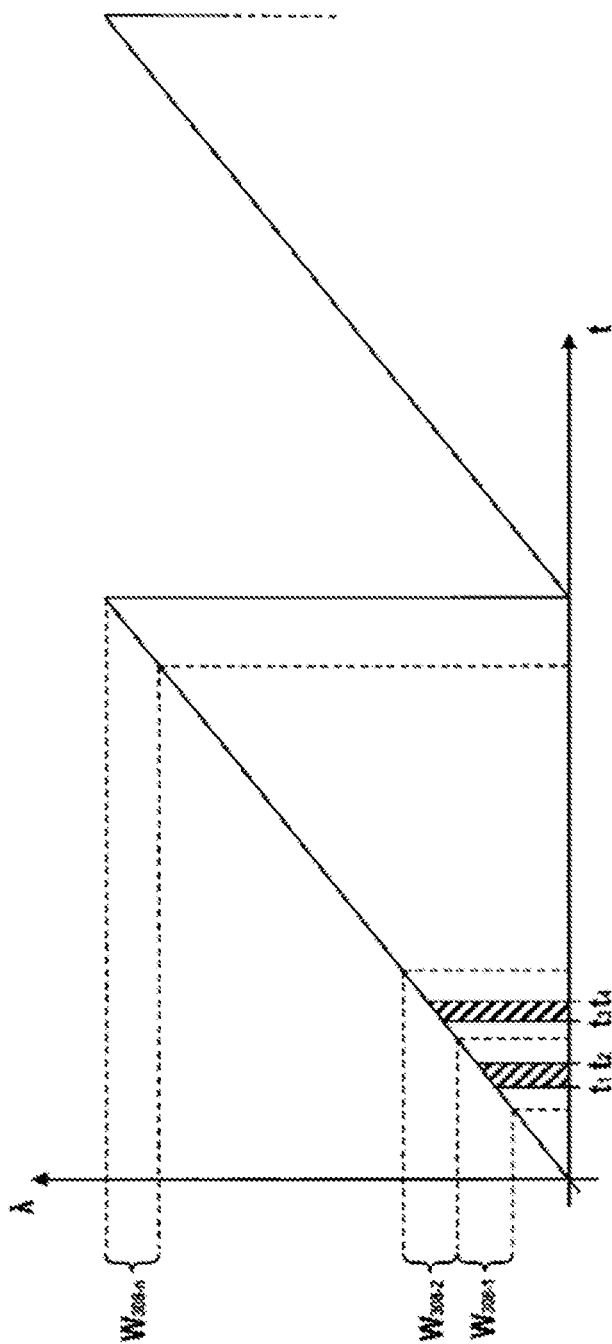
FIG. 6 shows a diagram of wavelength versus time, by way of example.

The radiation source 310 generates light L, and consequently the measuring beam 224, at a time-variable wavelength (also referred to as a "chirp"). FIG. 6 shows such light L by way of example. There, t denotes the time and λ denotes the wavelength of the light. The changing of the wavelength λ over time corresponds here to a sawtooth signal. However, any other desired signal forms are conceivable.

Upstream of each of the light-entry regions 307 there is another optical filter 308. Correspondingly, four filters 308-1 to 308-4, 308-5 to 308-n (where "n" is the total number of filters 308 per microsystem 202) etc. per light-exit region 306 or lens element 314-1, 314-2, 314-m (where "m" is the total number of light-exit regions 306 or lens elements 314 per microsystem 202) or mirrors 206-1, 206-k (where"k" is the total number of mirrors 206 per microsystem 202) are provided here, differing in each case with regard to their wavelength pass-band. The wavelength pass-bands are shown in FIG. 6 and are denoted by $W_{308-1}$ to $W_{308-n}$.

The actual wavelength $\lambda_{act}$ of the light L at a respective point in time t is known. For this purpose, the radiation source 310 may have the construction shown in FIG. 7. Light L generated by a tunable laser 700 is split. Part of it is provided for one or more microsystems 202. Another part of the light L is passed through a Mach-Zehnder interferometer 702 and subsequently impinges on a photodiode 704, which in turn is connected to evaluation electronics 706. Another part of the light L impinges on an optical filter 708, which only allows light of a predetermined wavelength $\lambda_0$ to pass through. The light that is allowed to pass through impinges on a photodiode 710, which in turn is connected to the evaluation electronics 706.

The evaluation electronics 706 integrate the change of the wavelength λ of the light L over time that is measured with the aid of the photodiode 704. With $\lambda_0$ at a specific point in time as a reference, the evaluation electronics can output the actual wavelength $\lambda_{act}$ at each point in time t. The actual wavelengthe $\lambda_{act}$ is provided for the microprocessor 232 (see FIG. 5B) of a respective microsystem 202.

If the microprocessor 232 then receives an (electrical) signal from the sensor units 230 (see FIG. 5B) in the time period t1 to t2 (see FIG. 6), it can, on the basis of the knowledge of the actual wavelength $\lambda_{act}$, readily deduce that the sensor unit 230 (not shown because it is concealed) assigned to the filter 308-1 is the one on which the currently reflected measuring beam 224' has impinged. In the same way, a signal in the time period $t_3$ to $t_4$ (FIG. 6) means that the measuring beam 224' has impinged on the sensor unit 230-2 assigned to the filter 308-2. If, furthermore, the actual intensity of the reflected measuring beam 224' (centroid) is sensed and evaluated, in each case the actual tilting angle α can be determined. This type of circuit allows high-speed tilting angle control.

Depending on the available bandwidth of the light L and the wavelength pass-bands $W_{308-1}$ to $W_{308-n}$ of the filters 308-1 to 308-n, it may be provided that the summated wavelength pass-bands $W_{308-1}$ to $W_{308-4}$, $W_{308-5}$ to $W_{308-8}$ etc. of a respective mirror 206-1, 206-k cover the entire available bandwidth of the light L. This may be the case for example if a large number of sensor units 307 together with assigned filters are available per mirror 206 or the wavelength pass-bands are very wide. In this case, the microprocessor 232 uses additional information, allowing an assignment of the signals received from the sensor units 230 to a respective mirror 206. This may be performed for example by the signals for a respective mirror 206 being transmitted to the microprocessor 232 on different channels (one for each mirror 206).

According to a further variant, it may be provided that the wavelength pass-bands $W_{308-1}$ to $W_{308-n}$ summated over a microsystem 202 cover the entire available bandwidth of the light L (as illustrated in FIG. 6). In this case, the microprocessor 232 does not require the additional information described above.

Finally, it is conceivable that only the wavelength pass-bands $W_{308-1}$ to $W_{308-m}$ (where M is the total number of different wavelength pass-bands in a respective module 400 or in the facet mirror 118) summated over a module 400 or the facet mirror 118 (see FIG. 4 or FIG. 8) cover the entire available bandwidth of the light L.

Figure 8:
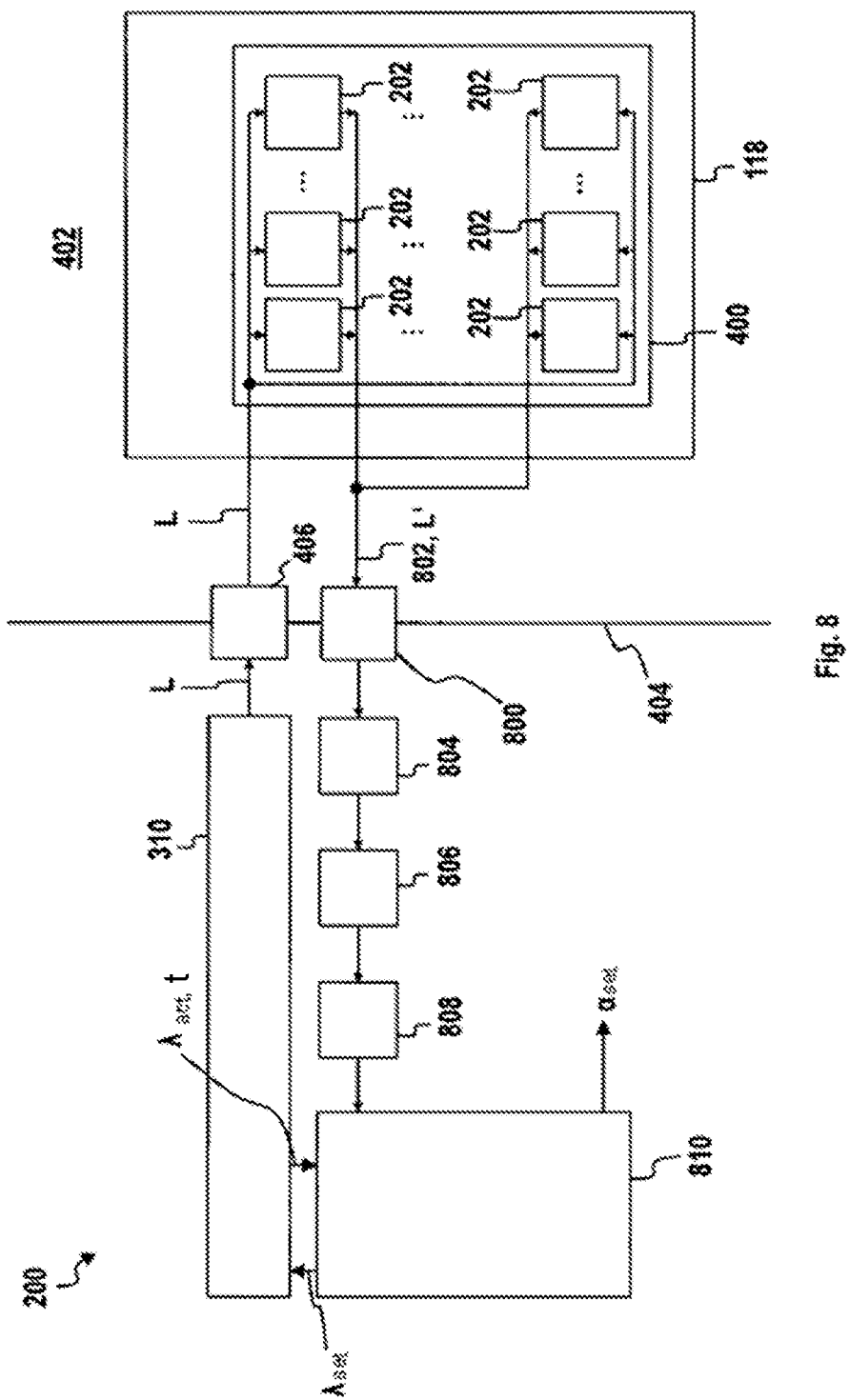
FIG. 8 shows an optical arrangement according to a fifth exemplary embodiment in a plan view.

FIG. 8 shows an arrangement 200 according to a fifth exemplary embodiment in a plan view, as seen for instance in a detail from one of the lithography apparatuses 100A, 100B.

Figure 7:
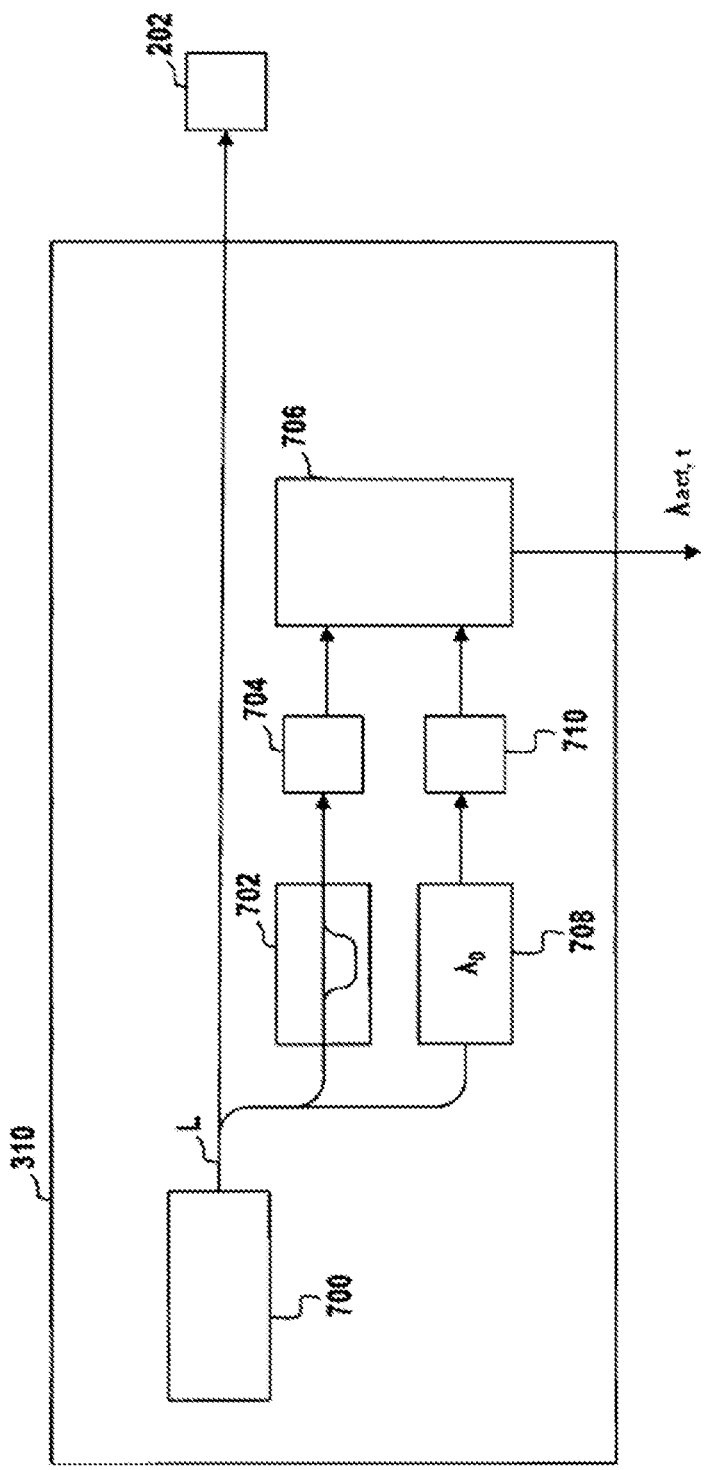
FIG. 7 schematically shows a radiation source according to an exemplary embodiment.

In the case of the exemplary embodiment according to FIG. 8, the radiation source 310 shown in FIG. 7 is used. This supplies light L by way of an interface 406 to microsystems 202 in multiple modules 400 of a facet mirror 118, as has been described in connection with FIG. 4. However— in contrast to the exemplary embodiment according to FIG. 4—the wavelength of the light L changes over time t.

Figure 9:
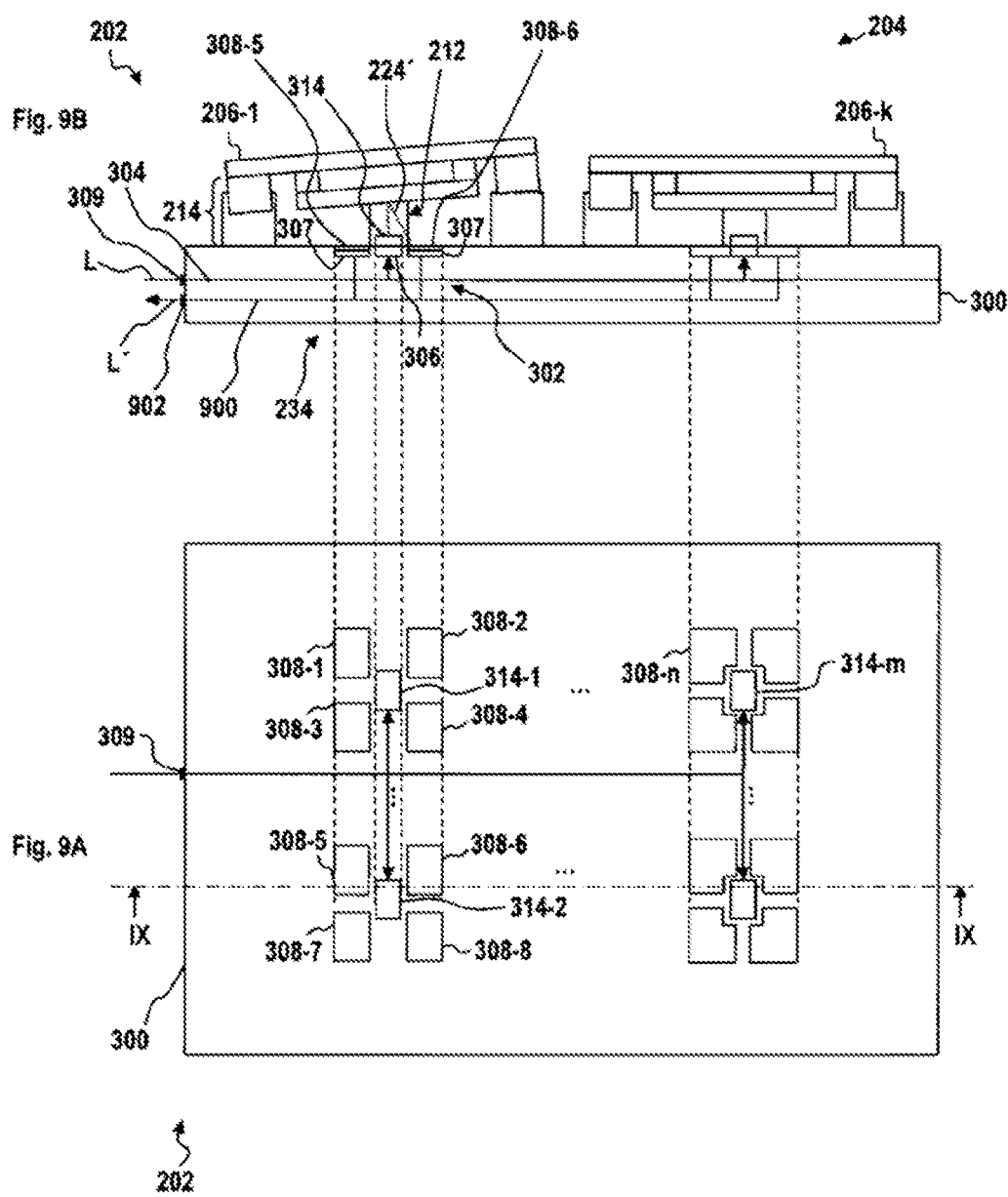
FIG. 9A schematically shows a microsystem from FIG. 8 in a plan view.
FIG. 9B shows a section IX-IX from FIG. 9A.

The microsystems 202 have the construction described below in FIGS. 9A and 9B for such a system. FIG. 9A schematically shows a plan view. FIG. 9B shows a section IX-IX from FIG. 9A.

The microsystem 202 has the substrate 300 described in FIGS. 5A and 5B, with the integrated optical unit 302. Optionally, the microsystem 202 does not have a substrate 210 with an integrated electrical circuit 234.

In addition to the components described in relation to FIGS. 5A and 5B, the integrated optical unit 302 includes a light guide 900, which guides the light L' of the reflected measuring beam 224' from the light-entry regions 307 to a port 902 on the substrate 300. At the port 902, the light L' is transferred to a fiber-optic cable (not shown) or the like and, as shown in FIG. 8, is passed to an interface 800 at the housing 404. It could also be provided that multiple light guides 900 are provided, respectively guiding light L' from some of the light-entry regions 307 to a respective port 902 (not shown). The light-entry regions 307 together with filters 308-1 to 308-n are designed in the same way as in the case of the exemplary embodiment according to FIGS. 5A and 5B.

As shown by FIG. 8, the light L' from a module 400 including multiple microsystems 202 is guided by way of precisely one channel 802 (for example in the form of a fiber-optic cable) to the interface 800. As an alternative, it may be provided that the light L' of the microsystems 202 of some of the modules 400 or even the light L' of the microsystems 202 of all of the modules 400, that is to say the facet mirror 118 as a whole, is guided by way of precisely one channel 802 to the interface 800.

Downstream of the interface 800 is a sensor unit 804, on which the light L' impinges. An electrical signal generated by the sensor unit 804 is amplified in an amplifier 806 and provided for a control and evaluation unit 810 via an analog-digital converter 808. The control and evaluation unit 810 is formed as a microprocessor, for example a programmable logic or ASIC (Application Specific Interated Circuit), and may have suitable memory such as a ROM, RAM etc.

The control and evaluation unit 810 is also connected for signaling purposes to the radiation source 310. From this, the control and evaluation unit 810 receives the actual wavelength $\lambda_{act}$ of the light L emitted at a respective point in time t. Consequently, the control and evaluation unit 810 can deduce the actual tilting angle $\alpha_{act}$ of a respective mirror 206 from the detection of signal strengths at the sensor unit 804 over a time period, which for example includes four of the wavelength pass-bands $W_{308-1}$ to $W_{308-n}$, with the aid of a corresponding centroid calculation (see above). Therefore, the information concerning the actual tilting angle $\alpha_{act}$ of a respective mirror 206 on the channel 802 is transmitted to the control and evaluation unit 810 in a multiplexing process (for example on the basis of the time-dependent wavelength of the light L and the filters 308-1 to 308-n). With the aid of the information concerning the actual wavelength $\lambda_{act}$ from the radiation source 310, the information concerning the actual tilting angle $\alpha_{act}$ is assigned again to a respective mirror 206 via the control and evaluation unit 810 and is thereby demultiplexed.

It may also be provided that the control and evaluation unit 810 controls the tunable radiation source 310 for generating the light L at a setpoint wavelength $\lambda_{set}$. Finally, the control and evaluation unit 810 may be set up to activate the actuators 214 for setting the setpoint tilting angle $\alpha_{set}$ of a respective mirror 206. The setpoint tilting angle $\alpha_{set}$ may likewise be provided for a respective actuator 214 via a waveguide (not shown).

The components 804, 806, 808 and 810 are all arranged outside the vacuum region 402. The functions provided by the components 804, 806, 808 and 810 may also be provided by a different circuit; the one shown here is given purely by way of example. For example, parts of the evaluation unit 810 may not be implemented in a digital form but in an analog form.

Figure 10:
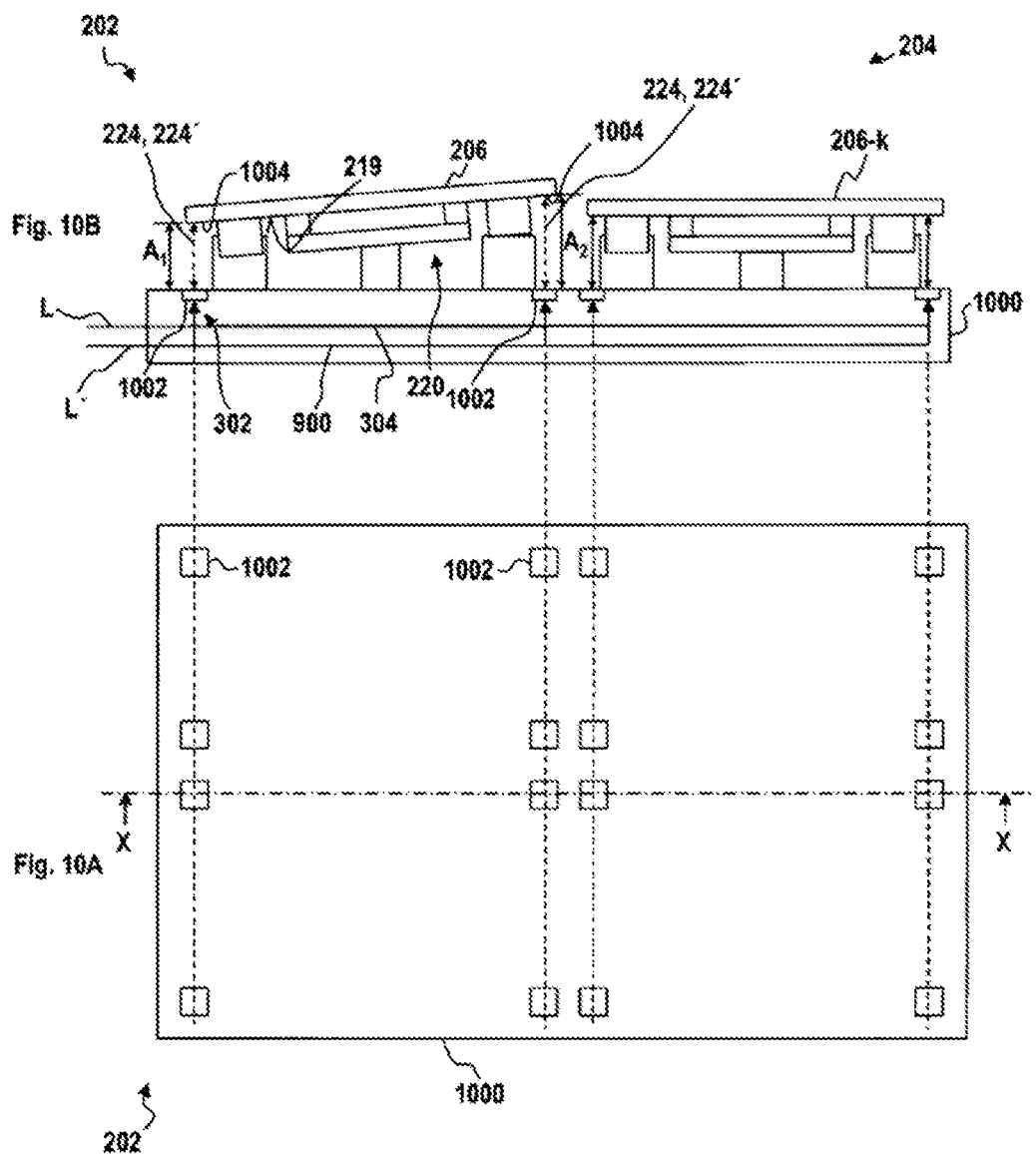
FIG. 10A schematically shows a microsystem according to a further exemplary embodiment in a plan view.
FIG. 10B shows a section X-X from FIG. 10A.

FIG. 10A schematically shows a microsystem 202 (for example for one of the lithography apparatuses 100A, 100B) according to the fifth exemplary embodiment in a plan view. FIG. 10 shows a section X-X from FIG. 10A.

The construction corresponds to that from FIGS. 5A and 5B, the substrate 1000 corresponding to the substrate 300 from FIGS. 5A and 5B, but with the difference that light-exit and light-entry regions 1002 (for example in the form of a grating coupler) are provided. These are respectively provided under peripheral regions 1004 of the mirrors 206 in the substrate 1000 and are a component part of the integrated optical unit 302. A respective light-exit and light-entry region 1002 uses the light L supplied via the light guide 304 to provide a measuring beam 224, which is reflected back into the light-exit and light-entry region 1002 at the peripheral region 1004. The reflected measuring beam 224' is shown in FIG. 10B as almost congruent with the measuring beam 224. The peripheral regions 1004 form part of the surface 219 of the rear side 220 of the mirrors 206. The reflection of the measuring beam 224 at the peripheral regions 1004, that is to say at the surface 219, has the effect that there is a direct reflection of the measuring beam 224 on the rear side 220 of the mirror 206. The peripheral regions 1004 or the surface 219 may be of a roughened form in order to scatter the measuring beam 224 to some extent. This allows the reflected measuring beam 224' to be sensed better at the light-exit and light-entry regions 1002.

The reflected measuring beam 224' is coupled by way of the light-exit and light-entry region 1002 back into the light guide 304 or a further light guide 900 (the light returned in the light guide is denoted by L') and is optically overlaid with the light L in the sensor unit 1200 (see FIG. 12). The output light L is provided from the radiation source 310 at the sensor unit 1200 via a connection 1202 (see FIG. 12). By applying the FMCW-LIDAR method, the distance $A_1$, $A_2$ between a respective light-exit and light-entry region 1002 and a respective peripheral region 1004 can be determined from the interference signal. In the aforementioned case where the reflected light L' travels back in the same light guide 304, a circulator (not shown) is provided, coupling out the light L' from the light guide 304 to the sensor unit 1200.

Figure 11:
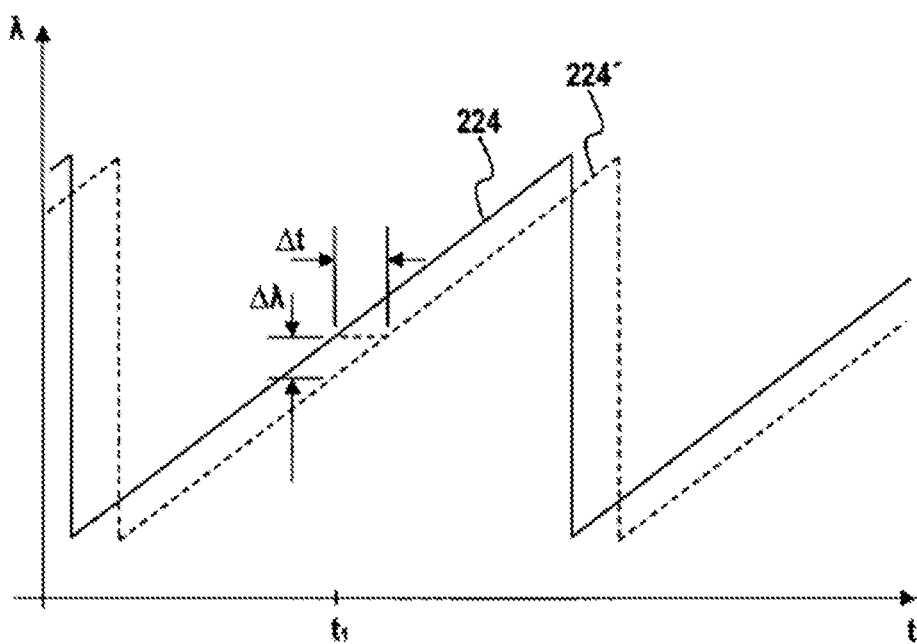
FIG. 11 shows parts of an FMCW-LIDAR method.

This FMCW-LIDAR method is illustrated in FIG. 11. The light L of the measuring beam 224 has a wavelength $\lambda$ and a corresponding frequency which changes over time t. Because of the signal transit time to the respective peripheral region 1004 and back—the reflected measuring beam 224' (that is to say the echo) has a different wavelength or frequency at the light-exit and light-entry region 1002 than the measuring beam 224 leaving the light-exit and light-entry region 1002 at the same point in time $t_1$. The wavelength difference $\Delta\lambda$ or frequency difference is determined with the aid of the aforementioned interference signal. The wavelength difference $\Delta\lambda$ or frequency difference is used to calculate the signal transit time, and consequently the distance $A_1$, $A_2$. In a variant of the FMCW-LIDAR method, in addition or as an alternative a phase difference between the emitted and reflected measuring beams 224, 224' is measured and is used in the determination of the distance $A_1$, $A_2$.

If three or more of the light-exit and light-entry regions 1002 per mirror 206 are provided (here in the example four), the tilting angle $\alpha$ can be determined exactly.

Apart from the different way of sensing of the tilting angle $\alpha$ of a respective mirror 206 described above, the exemplary embodiments described above apply correspondingly to the exemplary embodiment according to FIGS. 10A and 10B.

The exemplary embodiment according to FIGS. 10A and 10B can be combined with those exemplary embodiments that provide a tunable radiation source 310, because they already provide the light L at a time-dependent wavelength or frequency that is involved in the FMCW-LIDAR method. This is illustrated by way of example in FIG. 12. This shows the modified representation of FIG. 8. A sensor unit 1200, which senses the multiplexed signal from the light-exit and light-entry regions 1002, is provided here.

Although the present disclosure has been described on the basis of exemplary embodiments, it is modifiable in diverse ways.

LIST OF REFERENCE SIGNS

100A EUV lithography apparatus
100B DUV lithography apparatus
102 Beam-shaping and illumination system
104 Projection system
106A EUV radiation source
106B DUV radiation source
108A EUV radiation
108B DUV radiation
110 Mirror
112 Mirror
114 Mirror
116 Mirror
118 Mirror/facet mirror
120 Photomask
122 Mirror
124 Wafer
126 Optical axis
128 Lens element
130 Mirror
132 Medium
200 Arrangement
202 Microsystem
204 Mirror array
206 Mirror
208 Front side
210 Substrate
212 Mounting
214 Actuator
216 Comb
218 Comb
219 Surface
220 Rear side
222 Radiation source
224 Measurement radiation
224' Reflected measuring beam
226 Optical unit
228 Portion
230 Sensor unit
232 Microprocessor 234 Circuit
300 Substrate
302 Optical unit
304 Light guide
306 Light-exit region
307 Light-entry region
308 Filter
309 Port
310 Radiation source
312 Fiber-optic cable
314 Lens element
316 Vertical interconnect access
400 Mirror module
402 Vacuum region
404 Housing
406 Interface
408 Light guide
410 Channel
700 Laser
704 Photodiode
706 Evaluation electronics
708 Optical filter
710 Photodiode
800 Interface
802 Channel
804 Sensor unit
806 Amplifier
808 Analog-to-digital converter
810 Control and evaluation unit
900 Light guide
902 Port
1000 Substrate
1002 Light-exit and light-entry region
1004 Peripheral region
1200 Sensor unit
1202 Connection
A Distance
L Light
L' Light
M1 Mirror
M2 Mirror
M3 Mirror
M4 Mirror
M5 Mirror
M6 Mirror
W Wavelength pass-band
t Time
x Axis
y Axis
α Tilt angle
λ Wavelength

What is claimed is:

1. An optical arrangement, comprising:
a microsystem comprising a mirror array, the mirror array comprising a plurality of mirrors, a mirror of the plurality of mirrors comprising a first side and a second side opposite the first side, the first side being configured to reflect working light of a lithography apparatus, the second side being configured to reflect a measuring beam;
a radiation source configured to provide the measuring beam;
a sensor unit configured to sense a tilting angle of the mirror depending on the measuring beam reflected from the second side of the mirror; and
a plurality of filters assigned to the mirror,
wherein:
the radiation source is configured to vary the measuring beam at a wavelength which varies over time;
for each filter, the filter is configured to allow: i) the reflected measuring beam to pass through to the sensor unit only in a wavelength pass-band; or ii) a signal generated from the reflected measuring beam to pass through to the sensor unit only in the wavelength pass-band; and
each filter has a wavelength pass-band that is different from a wavelength pass-band of each of the other filters.

2. The optical arrangement of claim 1, wherein:
the optical arrangement comprises a plurality of microsystems, a plurality of radiation sources and a plurality of sensor units; and
for each microsystem, the microsystem comprises a plurality of mirrors, a mirror of the plurality of mirrors comprising a first side and a second side opposite the first side, the mirror having a respective radiation source and a respective sensor unit configured so that the respective radiation source provides a measuring beam to the second side of the mirror and the respective sensor unit senses a tilting angle of the mirror depending on the measuring beam reflected from the second side of the mirror.

3. The optical arrangement of claim 2, further comprising a substrate supporting the plurality of microsystems.

4. The optical arrangement of claim 3, wherein a facet mirror comprises the substrate and the plurality of microsystems.

5. The optical arrangement of claim 1, wherein the microsystem comprises a substrate, and the mirror is tiltably mounted to the substrate.

6. The optical arrangement of claim 1, wherein the microsystem comprises an integrated optical unit configured to guide the measuring beam to the mirror.

7. The optical arrangement of claim 6, wherein the integrated optical unit is configured to guide: i) guide the reflected measuring beam to the sensor unit; or ii) a signal generated depending on the reflected measuring beam to the sensor unit.

8. The optical arrangement of claim 1, wherein the microsystem comprises an integrated circuit, and the integrated circuit comprises the sensor unit.

9. The optical arrangement of claim 1, wherein the sensor unit is outside the microsystem.

10. The optical arrangement of claim 1, further comprising a light guide and a demultiplexer, wherein:
the microsystem comprises a multiplexer configured to multiplex the reflected measuring beam or a signal generated from the reflected measuring beam onto a light guide; and
the demultiplexer is configured to demultiplex the measuring beam or a signal multiplexed onto the light guide.

11. The optical arrangement of claim 1, wherein the sensor unit is configured to sense the tilting angle of the mirror depending on a deflection of the reflected measuring beam with respect to the measuring beam provided to the mirror by the radiation source.

12. The optical arrangement of claim 11, wherein the microsystem comprises a first substrate comprising multiple light-entry regions and a second substrate comprising the sensor unit, and the multiple light-entry regions are configured to guide the reflected measuring beam to the sensor unit.

13. The optical arrangement of claim 12, wherein the multiple light-entry regions comprise filters with different wavelength pass-bands.

14. The optical arrangement of claim 1, wherein the sensor unit is configured to sense the tilting angle of the mirror with the aid of a distance measurement depending on the measuring beam provided to the mirror and the measuring beam reflected from the mirror.

15. The optical arrangement of claim 14, wherein the sensor units is configured to perform the distance measurement according to an FMCW-LIDAR method.

16. An apparatus, comprising:
   an optical arrangement according to claim 1,
   wherein the apparatus is a lithography apparatus.

17. The apparatus of claim 13, further comprising:
   an illumination system comprising the optical arrangement; and
   a projection system.

18. The apparatus of claim 17, wherein the apparatus is an EUV lithography apparatus.

19. The apparatus of claim 17, wherein the apparatus is a DUV lithography apparatus.

20. The optical arrangement of claim 1, wherein the radiation source is outside the microsystem.

\* \* \* \* \*

UNITED STATES PATENT AND TRADEMARK OFFICE
CERTIFICATE OF CORRECTION

| | |
|---|---|
| PATENT NO. | : 11,402,760 B2 |
| APPLICATION NO. | : 17/480800 |
| DATED | : August 2, 2022 |
| INVENTOR(S) | : Jan Horn and Stefan Richter |

It is certified that error appears in the above-identified patent and that said Letters Patent is hereby corrected as shown below:

In the Specification

Column 7, Line 34, after "section" insert -- III-III --.

Column 13, Line 21, delete "wavelengthe" insert -- wavelength --.

Column 14, Line 45, delete "Interated" insert -- Integrated --.

Column 16, Line 6, delete "$A_2$" insert -- $A_2$. --.

In the Claims

Column 19, Line 19, Claim 17, delete "claim 13" and insert -- claim 16 --.

Signed and Sealed this
Eleventh Day of October, 2022

Katherine Kelly Vidal
*Director of the United States Patent and Trademark Office*